US010593684B2

(12) United States Patent
Herko et al.

(10) Patent No.: US 10,593,684 B2
(45) Date of Patent: Mar. 17, 2020

(54) PRINTED ELECTRONIC DEVICES EXHIBITING IMPROVED YIELD

(71) Applicant: Xerox Corporation, Norwalk, CT (US)

(72) Inventors: Jonathan H. Herko, Walworth, NY (US); Michael S. Roetker, Webster, NY (US); Kyle B. Tallman, Perry, NY (US); Scott J. Griffin, Fairport, NY (US); Amy Catherine Porter, Rochester, NY (US); David M. Skinner, Rochester, NY (US); Lin Ma, Pittsford, NY (US); Eric Robert Dudek, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/038,309

(22) Filed: Jul. 18, 2018

(65) Prior Publication Data

US 2020/0027887 A1    Jan. 23, 2020

(51) Int. Cl.
*H01L 27/11*        (2006.01)
*H01L 27/11502*    (2017.01)
*G11C 11/22*        (2006.01)

(52) U.S. Cl.
CPC ...... *H01L 27/11502* (2013.01); *G11C 11/221* (2013.01); *G11C 11/2259* (2013.01); *G11C 11/2273* (2013.01); *G11C 11/2275* (2013.01)

(58) Field of Classification Search
CPC .............................. H01L 21/288; H01L 24/03
See application file for complete search history.

(56) References Cited

U.S. PATENT DOCUMENTS

| 3,720,862 | A  | 3/1973  | Mason          |
|-----------|----|---------|----------------|
| 4,713,157 | A  | 12/1987 | McMillan et al.|
| 5,214,300 | A  | 5/1993  | Rohrer et al.  |
| 7,374,954 | B2 | 5/2008  | Kang           |
| 9,412,705 | B2 | 8/2016  | Karlsson et al.|

(Continued)

FOREIGN PATENT DOCUMENTS

| WO | WO2006135245 | 12/2006 |
| WO | WO2006135246 | 12/2006 |
| WO | WO2006135247 | 12/2006 |

*Primary Examiner* — Caridad Everhart
*Assistant Examiner* — Ankush K Singal
(74) *Attorney, Agent, or Firm* — Bell & Manning, LLC

(57) ABSTRACT

A printed electronic device may comprise a plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, and a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers. The plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad.

15 Claims, 5 Drawing Sheets

(56) References Cited

U.S. PATENT DOCUMENTS

| | | | |
|---|---|---|---|
| 2005/0279838 A1* | 12/2005 | Wang | G06K 19/077 |
| | | | 235/492 |
| 2007/0049155 A1 | 3/2007 | Moro et al. | |
| 2007/0138520 A1 | 6/2007 | Leenders et al. | |
| 2007/0243678 A1* | 10/2007 | Newsome | B82Y 10/00 |
| | | | 438/238 |
| 2011/0157682 A1 | 6/2011 | Zang et al. | |
| 2013/0256673 A1 | 10/2013 | Nishiyama | |
| 2017/0068830 A1* | 3/2017 | Fowler | G06K 7/0013 |

* cited by examiner

PRINTED ELECTRONIC DEVICES EXHIBITING IMPROVED YIELD

BACKGROUND

Printed electronics based on memory cells are used in a wide variety of applications, including as labels, tags and sensors. The memory cells are capacitor-like structures, each structure including a layer of a memory material sandwiched between a pair of electrode layers. The memory cells may be accessed via conductive traces linking the electrodes to an electronic driver and detection circuitry which may be located on the periphery of the memory cells or in a separate module, e.g., a read/write unit. Depending upon the application, the printed electronic device may contain a few or up to several million memory cells. Regardless of the particular configuration of the printed electronic device, the yield of the device is generally maximized in order for the device to operate as intended (e.g., to allow for accurate and efficient reading of, and writing to, the individual memory cells). Unfortunately, despite the advantages of the various printing methods (e.g., inkjet printing, screen printing, gravure printing, etc.) used to fabricate printed electronic devices, many factors in the fabrication process can contribute to reduced yield of the devices.

SUMMARY

Provided are printed electronic devices exhibiting improved yield and methods of fabricating and using such devices.

In embodiments, printed electronic devices are provided, which comprise a plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, and a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers. The plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad.

In embodiments, methods of fabricating printed electronic devices are provided which comprise printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; and printing a plurality of contact pads on the plurality of electrode traces, wherein the plurality of contact pads is arranged in another pattern and each electrode trace of the plurality of electrode traces is in electrical communication with an associated contact pad of the plurality of contact pads. The plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad.

In embodiments, methods of using printed electronic devices are provided which comprise contacting a plurality of contact pads of a printed electronic device with a plurality of pins of a read/write unit, the electronic device comprising the plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, and a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers. The plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad.

These and other aspects will be discussed in greater detail below.

BRIEF DESCRIPTION OF THE DRAWINGS

Illustrative embodiments will hereafter be described with reference to the accompanying drawings.

DETAILED DESCRIPTION

Figure 1A:
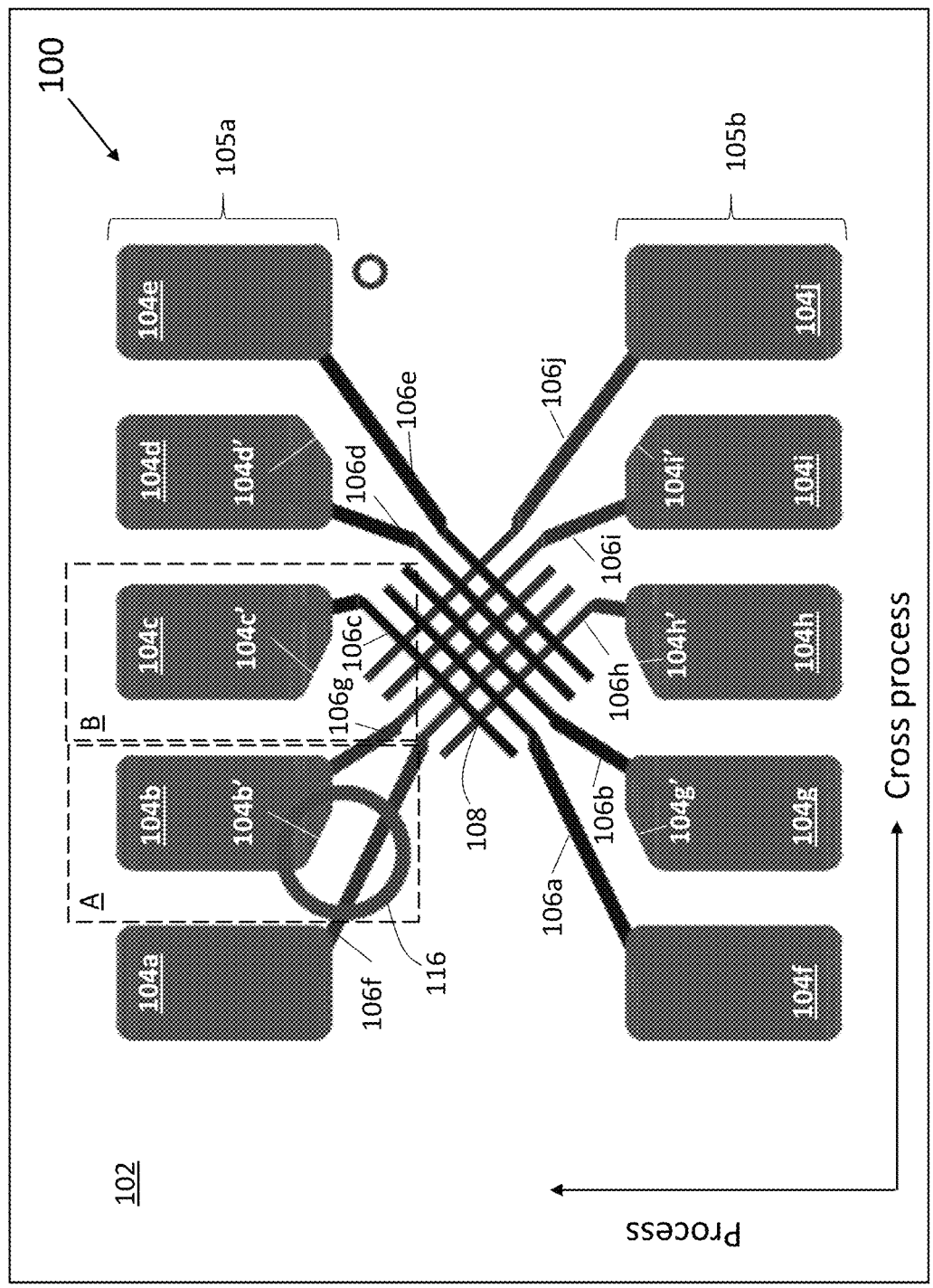
FIG. 1A depicts a top view of a printed electronic device according to an illustrative embodiment.

Provided are printed electronic devices exhibiting improved yield and methods of fabricating and using such devices.

The printed electronic devices are based on arrays or matrices of memory cells known as passive arrays or matrices. The devices are multilayer structures comprising stacked layers, each layer composed of a different material and/or configured in a different pattern, depending upon the function of the layer. The devices comprise a plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; and a plurality of memory cells, each memory cell located at an intersection of a pair of electrode traces of the plurality of electrode traces. Each memory cell comprises a bottom electrode layer, a top electrode layer, and a ferroelectric layer between the top and bottom electrode layers. The top and bottom electrode layers of the memory cells correspond to regions of top and bottom electrode traces, respectively. Moving from bottom to top in the devices, the set of bottom electrode traces is one of the layers of the multilayer structure, the ferroelectric layer is a layer overlying the set of bottom electrode traces, the set of top electrode traces is a layer overlying the ferroelectric layer, and the plurality of contact pads is a layer overlying the set of top electrode traces.

The contact pads of the plurality of contact pads provide an electrical point of contact with pins of a read/write unit configured to generate voltage waveforms to control the reading/writing of the plurality of memory cells and to sense the state of the memory cells during reading. Conventionally, the surface area of each contact pad is maximized so as to reduce the problem of misalignment of the contact pads/pins when the printed electronic device and read/write unit are brought into contact. In addition, for ease of fabrication, contact pads have been made with uniform sizes and shapes (i.e., all contact pads on the same printed electronic device have the same size and shape).

The present disclosure is based, in part, on the finding that the yield of printed electronic devices can be improved (i.e., increased) by modifying the size and/or shape of some of the contact pads on the same printed electronic device. The modification (whether in size and/or shape) results in a reduction of the surface area of the modified contact pads (as compared to other, unmodified contact pad(s) in the printed electronic device). Thus, in the present printed electronic devices, the plurality of contact pads comprises one or more contact pads having a reduced surface area as compared to one or more other contact pads in the plurality of contact pads. The contact pads having a reduced surface area and a modified size and/or shape may be referred to herein as "modified contact pads." The other contact pads in the printed electronic device may be referred to herein as "unmodified contact pads." When a printed electronic device having both modified and unmodified contact pads is printed on the same printing system as a comparative printed electronic device having only unmodified contact pads, it is found that the yield of the printed electronic device having both modified and unmodified contact pads is significantly higher. This is illustrated below with respect to illustrative embodiments of printed electronic devices (see FIGS. 1A and 2A).

A variety of shapes and sizes may be applied to the modified contact pads, provided the shape or size or both differs from the larger surface area unmodified contact pad(s) in the printed electronic device. Illustrative shapes include non-rectangular polygonal shapes, e.g., triangular, pentagonal, hexagonal, etc. The non-rectangular polygonal shape may be irregular by which it is meant that not all sides have equal lengths and not all angles are equal. Rectangular shapes may be used for modified contact pads, provided the unmodified contact pads have a larger surface area and either a non-rectangular shape or a larger, rectangular shape.

The modified contact pad generally has an edge configured such that a clearance between the edge and a closest neighboring electrode trace is at least $2*\sqrt{2}*$(line registration capability). By "closest neighboring electrode trace," it is meant an electrode trace of the plurality of electrode traces which is associated with (i.e., in electrical communication with) a contact pad other than the modified contact pad and which is closest to the modified contact pad. This could be, e.g., an electrode trace associated with a contact pad adjacent to the modified contact pad, but it may be an electrode trace associated with a non-adjacent contact pad. By "line registration capability" it is meant the registration error value associated with the printing apparatus used to print the plurality of contact pads. The registration error value for a printing apparatus may be provided by the manufacturer of the printing apparatus or may be determined by monitoring printed registration marks against a fixed datum to which all printed layers are registered against. In embodiments, the clearance is at least 500 µm, at least 700 µm, at least 900 µm, or in the range of from 500 µm to 900 µm.

The clearance between an edge of a modified contact pad and a closest neighboring electrode trace may be determined by measuring distances between respective points along the length of the edge of the modified contact pad and the length of the closest neighboring electrode trace. If each of the measured distances satisfies one of the clearance values described above, the edge is considered to be appropriately configured. Instead of measuring distances between respective points distributed along the lengths of the edge/closest neighboring electrode trace, the distance between a closest pair of respective points along the length of the edge of the modified contact pad and the length of the closest neighboring electrode trace may be measured. This is further illustrated in FIGS. 1B, 1C, 2B and further described below. In the design phase, distances may be calculated using CAD software. Post production, these distances may be measured with a video measurement system.

A top view of an illustrative printed electronic device 100 is shown in FIG. 1A. The process and cross-process directions are labeled in FIG. 1A. An outline illustrating the edge of a substrate 102 upon which the layers of the device 100 is shown. However, the substrate 102 may be much larger such that many printed electronic devices may be printed thereon. The device 100 comprises a plurality of contact pads 104*a-j* arranged in a pattern and a plurality of electrode traces 106*a-j* arranged in another pattern. The pattern of the plurality of contact pads 104*a-j* is that of two, linear arrays 105*a, b*, extending parallel to one another and parallel to the cross-process direction. The linear arrays 105*a, b* are spaced apart in the process direction to define a gap between. The plurality of electrode traces 106*a-j* is positioned in this gap. Each electrode trace of traces 106*a-j* is in electrical communication with an associated contact pad of pads 104*a-j*, e.g., electrode trace 106*a* and contact pad 104*f* are an associated pair.

The plurality of electrode traces 106*a-j* includes both top electrode traces 106*a-e* and bottom electrode traces 106*f-j*. (Both are visible because a ferroelectric layer formed between top and bottom electrode traces 106*a-e*, 106*f-j* is not shown.) Portions of both top and bottom electrode traces 106*a-e*, 106*f-j* are configured as stripes wherein the stripe portions of top electrode traces 106*a-e* are oriented parallel to each other and the stripe portions of the bottom electrode traces 106*f-j* are oriented parallel to each other and orthogonal to the top electrode traces 106*a-e*, thereby forming a grid pattern. The remaining portions of the top and bottom electrode traces 106*a-e*, 106*f-j* extend linearly to their associated contact pads. In this embodiment, the grid pattern is oriented 45° with respect to the process and cross-process directions. Although other orientations may be used, the 45° orientation is useful because it minimizes any shift in the bit's physical location and associated electrical response due to straight process or cross-process shifts in the registration of the device. When compared with a device whose matrix is arranged orthogonally with the printing direction, a matrix arranged at 45° will minimize the resultant offset in any registration error by a factor of $1/\sqrt{2}$.

Figure 1C:
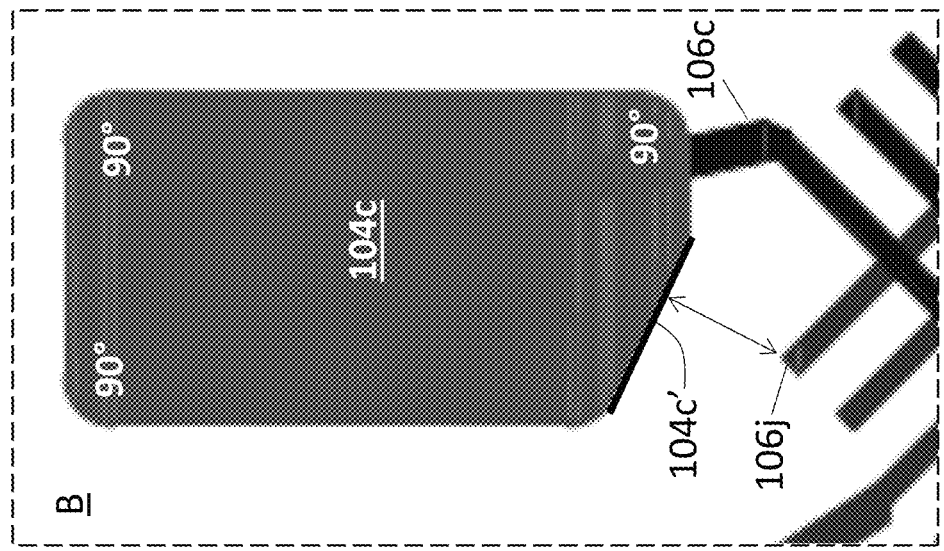
FIG. 1C depicts an expanded view of section B of the printed electronic device of FIG. 1A.

As noted above, each memory cell of the plurality of memory cells is formed at an intersection of a pair of electrode traces of the plurality of electrode traces 106a-j. One such intersection and memory cell is labeled 108. Although not shown in FIG. 1A, the printed electronic device 100 comprises the ferroelectric layer between the top and bottom electrode traces 106a-e, 106f-j. A cross-sectional view of the memory cell 108 is illustrated in FIG. 1D, showing a top electrode layer 110, a bottom electrode layer 112, and a ferroelectric layer 114 between the top and bottom electrode layers 110, 112. The top electrode layer 110 corresponds to a region of the top electrode trace 106c. The bottom electrode layer 112 corresponds to a region of the bottom electrode trace 106h at the intersection. Turning back to FIG. 1A, the device 100 includes 25 memory cells. Due to the configuration of the plurality of electrode traces 106a-j (i.e., grid pattern), the plurality of memory cells is arranged as a 5×5 matrix of memory cells.

Turning back to the plurality of contact pads 104a-j, the printed electronic device 100 includes contact pads 104a, e, f, j having a rectangular shape. In the present disclosure, the term "rectangular" includes rectangles having sharp corners as well as rectangles having rounded corners as shown in FIG. 1A. Both such corners may be considered to define a 90° angle. The device 100 also includes contact pads 104b-d and g-i having a reduced surface area and a different, non-rectangular shape as compared to contact pads 104a, e, f, j. Specifically, the contact pads 104b-d and g-i each have a non-rectangular but polygonal shape, more specifically, that of an irregular pentagon. Each contact pad 104b-d and g-i has three 90° angles, two angles greater than 90°, and five sides of different lengths. (Also see FIGS. 1B and 1C which show expanded views of contact pad 104b (FIG. 1B) and contact pad 104c (FIG. 1C).) Although other shapes may be used for contact pads 104b-d and g-i, each contact pad has an edge configured such that the clearance between the edge and a closest neighboring electrode trace is at least $2*\sqrt{2}*$(line registration capability).

Figure 1B:
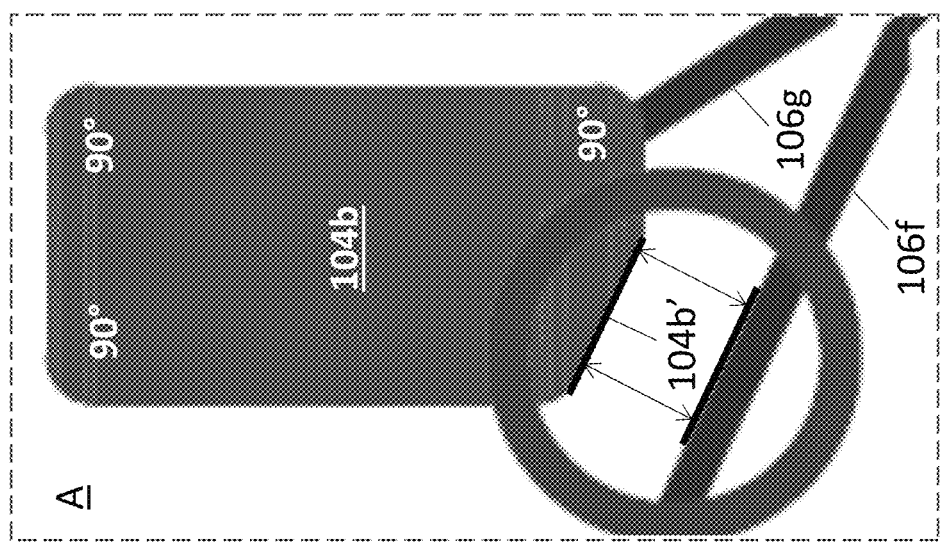
FIG. 1B depicts an expanded view of section A of the printed electronic device of FIG. 1A.
Figure 1D:
FIG. 1D depicts a cross-sectional view of a memory cell of the printed electronic device of FIG. 1A.

Turning to FIG. 1B, which is an expanded view of section A of FIG. 1A, an edge of the contact pad 104b is labeled 104b'. A circle 116 highlights the area between the edge 104b' and contact pad 104b's closest neighboring electrode trace, bottom electrode trace 106f. The edge 104b' is linear and oriented parallel with respect to top electrode trace 106f. As such, the distances between respective points along the length of edge 104b' and the length of electrode trace 106a are the same, i.e., the clearance is constant along the lengths. This clearance is at least $2*\sqrt{2}*$(line registration capability). This is illustrated via the two arrows, each representing a distance measured between a set of respective points along the length of edge 104b' and the length of electrode trace 106f. The distances are measured perpendicular to the lengths of the edge 104b' and the electrode trace 106f since this corresponds to the shortest distance between respective points along the lengths.

Turning to FIG. 1C, which is an expanded view of section B of FIG. 1A, an edge of the contact pad 104c is labeled 104c'. Contact pad 104c's closest neighboring electrode trace is bottom electrode trace 106j. The edge 104c' is linear, although due to the 45° orientation of the grid pattern of the plurality of electrodes 106a-j, the edge 104c' is not oriented parallel to the length of bottom electrode trace 106j. However, the distance between a closest pair of respective points along the length of edge 104c' and the length of bottom electrode trace 106j is indicated by the arrow included in FIG. 1C. This distance is at least $2*\sqrt{2}*$(line registration capability).

Turning back to FIG. 1A, contact pad 104d also has a linear edge 104d' configured to have a clearance of at least $2*\sqrt{2}*$(line registration capability) with respect to its closest neighboring electrode trace, top electrode trace 106e. In addition, the linear edge 104d' is oriented parallel to top electrode trace 106e. Contact pad 104g has a linear edge 104g' configured to have a clearance of at least $2*\sqrt{2}*$(line registration capability) with respect to its closest neighboring electrode trace, top electrode trace 106a. In addition, the linear edge 104g' is oriented parallel to top electrode trace 106a. Contact pad 104h has a linear edge 104h' configured to have a clearance of at least $2*\sqrt{2}*$(line registration capability) with respect to its closest neighboring electrode trace, top electrode trace 106e. Contact pad 104i has a linear edge 104i' configured to have a clearance of at least $2*\sqrt{2}*$(line registration capability) with respect to its closest neighboring electrode trace, bottom electrode trace 106j. In addition, the linear edge 104i' is oriented parallel to the bottom electrode trace 106j.

In summary, the device 100 has four unmodified contact pads, the rectangular contact pads 104a, e, f, j and six modified contact pads, the irregular pentagonal contact pads 104b-d and g-i.

A roll comprising printed electronic devices configured according to the embodiment of device 100 was fabricated according to the method described below. Specifically, a printing system comprising a printing apparatus configured to gravure print silver (for the plurality of electrode traces), a printing apparatus configured to extrusion coat a ferroelectric material (for the ferroelectric layer), and a printing apparatus configured to rotary screen print carbon (for the plurality of contact pads) was used. A roll of comparative printed electronic devices was fabricated using the same printing system and the same method, but each of the contact pads was configured as a rectangle, i.e., configured as contact pads 104a, e, f, j so that all contact pads 104a-j had the same shape, size and surface area. Rolls generally have between 200,000 and 1,000,000 printed electronic devices. Yield was evaluated as follows. A sample set of memory cells (1400 memory cells) in the devices of each roll was evaluated for short circuit failures, a common failure mode of printed electronic devices. Commercially available ohm meters may be used to test for short circuit failures. The greater the percentage of cells exhibiting short circuit failures, the lower the yield. In the sample set from the roll of comparative printed electronic devices, 84.8% of the cells exhibited short circuit failures. By contrast, in the sample set from the roll of printed electronic devices according to the embodiment of device 100, only 27.3% of the cells exhibited short circuit failures. Thus, yield for printed electronic devices according to the embodiment of device 100 increased by more than a factor of 3 as compared to the comparative printed electronic devices. Improvement in yield of more than a factor of 3 is extremely commercially significant.

Figure 2A:
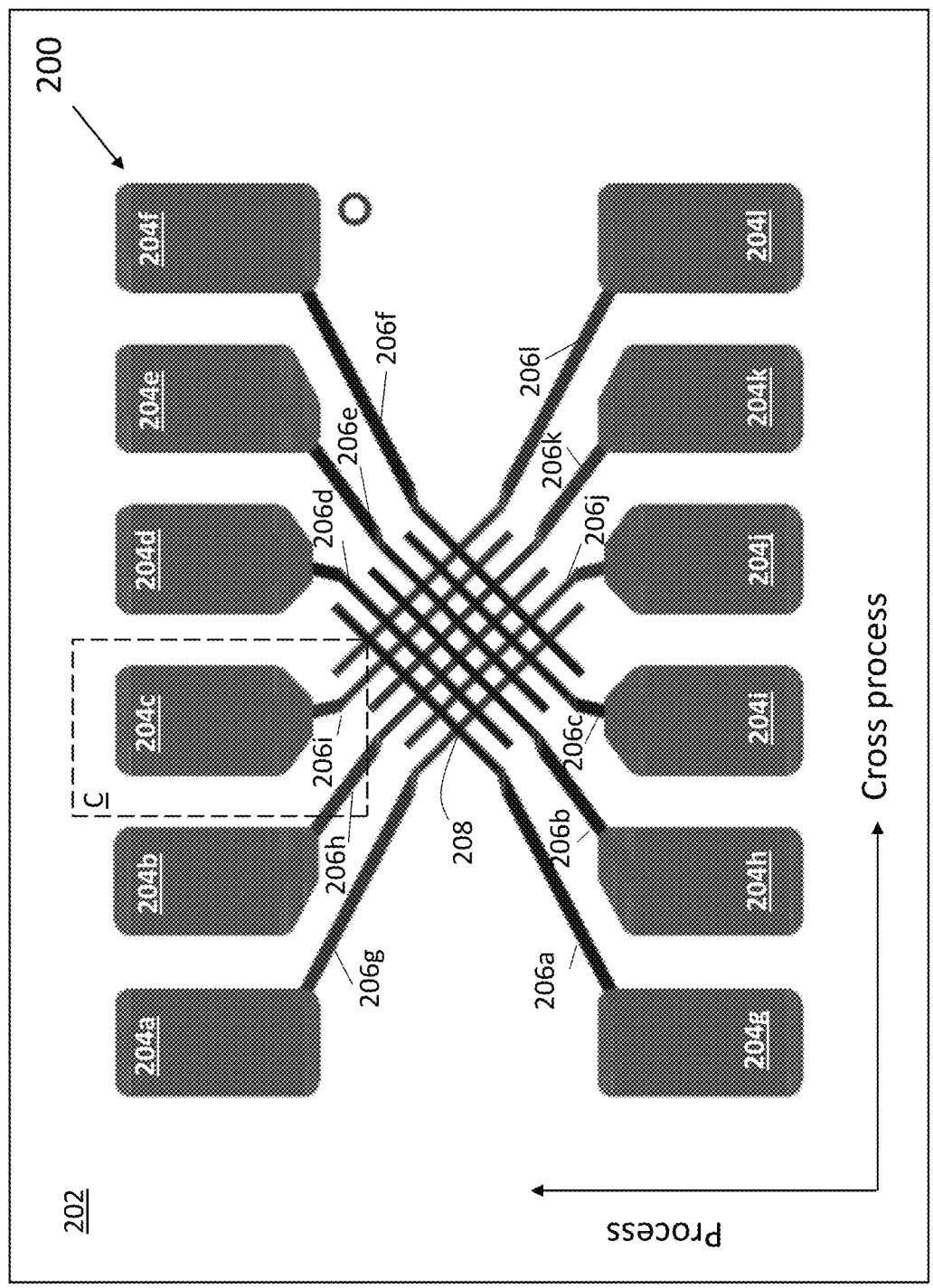
FIG. 2A depicts a top view of a printed electronic device according to another illustrative embodiment.

A top view of another illustrative printed electronic device 200 is shown in FIG. 2A. An outline illustrating the edge of a substrate 202 upon which the layers of the device 200 is shown. The device 200 is configured similarly to the device 100 of FIG. 1A, except that the device 200 includes two additional contact pads, two additional electrode traces, and thus, additional memory cells (in this embodiment, 11). Specifically, the device 200 comprises a plurality of contact pads 204a-l arranged in a pair of linear arrays. The device 200 further comprises a plurality of electrode traces 206a-l arranged in a grid pattern, the grid pattern positioned between the two linear arrays of contact pads and oriented 45 degrees with respect to the process and cross-process directions. Each electrode trace of traces 206a-l is in electrical communication with an associated contact pad of pads 204a-l. The plurality of electrode traces 206a-l includes both top electrode traces 206a-f and bottom electrode traces 206g-l. Portions of both top and bottom electrode traces 206a-f and g-l are configured as stripes to form the grid pattern, with the remaining portions extending linearly to their associated contact pads. In this embodiment, however, the top and bottom electrode traces 206a-f and g-l extend to electrode pads (not shown) positioned on an associated contact pad. Electrode pads are useful to improve the electrical contact between the electrode pads and their associated contact pads. In this embodiment, the electrode pads are rectangular in shape, but other shapes and sizes may be used.

As noted above, each memory cell of the plurality of memory cells is formed at an intersection of a pair of electrode traces of the plurality of electrode traces 206a-l. One such intersection is labeled 208. Although not shown, a cross-sectional view of the memory cell 208 would look similar to that of the memory cell 108 shown in FIG. 1D. In the embodiment of FIG. 2A, however, the device 200 includes 36 memory cells arranged as a 6×6 matrix due to the additional two electrode traces.

Turning back to the plurality of contact pads 204a-l, the printed electronic device 200 includes contact pads 204a, f, g, l (unmodified contact pads) having a rectangular shape, each defining four 90° angles. The device 200 also includes contact pads 204b-e and h-k (modified contact pads) having a reduced surface area and a different, non-rectangular shape as compared to contact pads 204a, f, g, l. In this embodiment, although all of the modified contact pads 204b-e and h-k are polygonal in shape, not all have the same polygonal shape. Specifically, the contact pads 204b, e, h, k each have an irregular pentagonal shape while the contact pads c, d, i, j each have an irregular hexagonal shape. As with the device 100 of FIG. 1A, contact pads 204b, e, h, k each have three 90° angles, two angles of greater than 90°, and five sides of unequal lengths. However, contact pads 204c, d, i, j each have only two 90° angles, four angles of greater than 90°, four sides of unequal lengths, and two sides of equal lengths.

Although other shapes may be used for contact pads 204b-e and h-k, as shown in FIG. 2A, each contact pad has an edge configured such that a clearance between the edge and a closest neighboring electrode trace is at least $2*\sqrt{2}*$(line registration capability). In particular, contact pads 204b, e, h, k are configured similarly to contact pads 104b, d, g, i of the device 100 of FIG. 1A. However, contact pads 204c, d, i, j, each have an edge configured such that a clearance between an edge and a next closest neighboring electrode trace is also at least $2*\sqrt{2}*$(line registration capability).

Figure 2B:
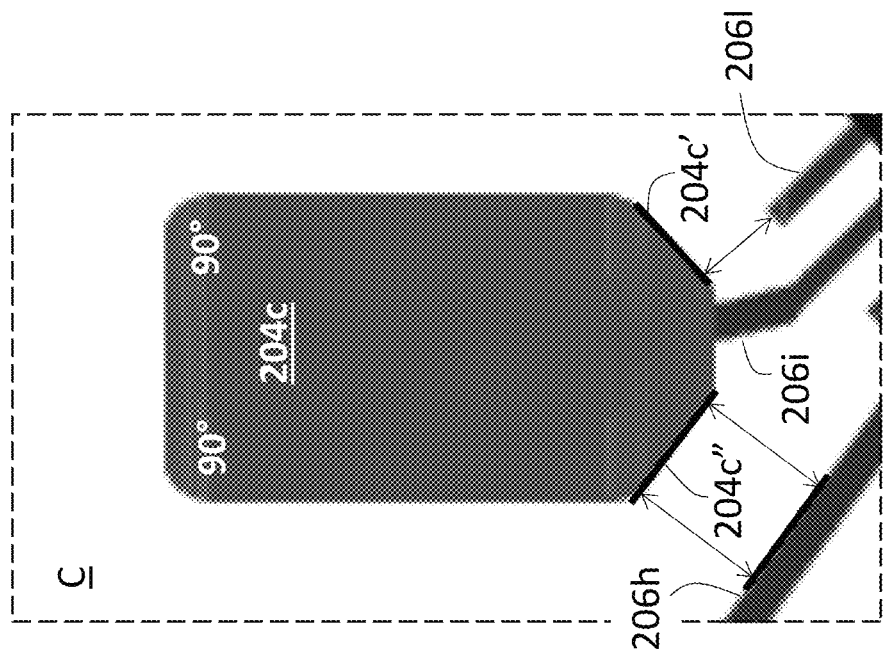
FIG. 2B depicts an expanded view of section C of the printed electronic device of FIG. 2A.

Turning to FIG. 2B, which is an expanded view of section C, contact pad 204c is shown having a closest neighboring electrode trace, bottom electrode trace 206l, and a next closest neighboring electrode trace, bottom electrode trace 206h. An edge 204c' is linear and the clearance (indicated by the arrow) is at least $2*\sqrt{2}*$(line registration capability). Another edge 204c" is linear and is also parallel with respect to bottom electrode trace 206h. The clearance (indicated by the arrows) between the edge 204c" and bottom electrode trace 206h is also at least $2*\sqrt{2}*$(line registration capability). It is noted that if bottom electrode traces 206h and 206l were equally close to contact pad 204c, both edges 204c' and 204c" could be considered to be "closest neighboring electrode traces."

As described above, contact pads arranged in linear arrays and electrode traces arranged in a grid pattern to form a matrix of memory cells may be used. However, other arrangements and patterns may be used. For example, contact pads may be arranged in circular or matrix patterns and may assume a variety of lateral positions over an underlying substrate with respect to the electrode traces and memory cells. In addition, by an appropriate configuration of electrode traces, memory cells can be arranged to form linear arrays, e.g., using a single (1) common bottom electrode and N parallel top electrodes oriented orthogonal to the bottom electrode (i.e., a 1×N linear array). The matrix arrays shown in FIGS. 1A and 2A are illustrative N×N matrix arrays, having N top electrode traces and N bottom electrode traces. However, nonequal numbers of top and bottom electrode traces may be used, e.g., M bottom electrode traces and N top electrode traces to form an M×N matrix array. In addition, as noted above, the orientation of the pattern of the plurality of electrode traces relative to the plurality of contact pads may vary. In addition, the portions of the electrode traces extending from the memory cells to their associated contact pads can assume a variety of paths.

The materials used for the various layers of the printed electronic device depend upon the application for the printed electronic device and the particular function of each layer. Illustrative materials for the substrate include silicon, glass, polymer, paper, etc., Illustrative materials for the electrode traces/electrode layers include metals, e.g., silver, or conductive polymers, e.g., polyethylenedioxythiophene. Illustrative materials for the ferroelectric layer include ferroelectric polymers, e.g., copolymer of polyvinylidene fluoride and trifluoroethylene. Other layers may be included in the printed electronic devices, e.g., insulating layers composed of insulating polymers, e.g., acrylic-based polymers, between the substrate and bottom electrode traces, which improve planarization and promote adhesion. A protective layer may be provided as a topmost layer on the printed electronic device to provide against contamination, oxidation, UV degradation, physical wear, etc. Protective layers may be composed of distinct sublayers made of different compositions. A topmost sublayer may be formed of a curable polymeric composition (e.g., polyesters, polyethers). Curable compositions may be used as described in U.S. Patent Application filed Jul. 18, 2018 for "PROTECTIVE LAYERS FOR HIGH-YIELD PRINTED ELECTRONIC DEVICES," now U.S. Pat. No. 10,304,836, which is hereby incorporated by reference in its entirety. Illustrative materials for an underlying sublayer of a protective layer include polypropylene glycol (PPG), silicon rubber, natural rubber, polyvinyl acetate and acrylate-based resins. Protective layers (including their sublayers) may be configured as described in U.S. Patent Application filed Jul. 18, 2018 for "COATED PRINTED ELECTRONIC DEVICES EXHIBITING IMPROVED YIELD," now U.S. Pat. No. 10,249,625, which is hereby incorporated by reference in its entirety. Other illustrative materials include those described in U.S. Pat. No. 9,412,705 and International Pat. Pub. Nos. WO 2006/135246 and WO 2006/135247, each of which is hereby incorporated by reference in its entirety.

Aside from the requirements regarding the clearance values described above, other dimensions of the features of the printed electronic devices as well as the overall dimensions of the printed electronic devices may be selected depending upon the application and number of memory cells. The printed electronic devices may be used in a variety of applications, including product authentication applications for print cartridges, event tickets, credit cards, etc.

Methods of fabricating the disclosed printed electronic devices are also provided. The methods are carried out on printing systems comprising one or more printing apparatuses configured to print material layers using a thin-film printing technique, e.g., ink-jet printing, screen printing, flexographic printing, offset printing, electrographic printing, gravure printing, extrusion coating, etc. Since different material layers may be printed using different techniques, the printing system can include multiple, different types of printing apparatuses. The printing apparatuses used in the printing system may be characterized by a line registration capability. The line registration capability may be at least 50 µm, at least 75 µm, at least 100 µm, at least 150 µm, at least 200 µm, at least 250 µm, or in the range of from 50 to 300 µm. The methods involve the sequential printing of the material layers of the desired printed electronic device, in a bottom-up, layer-by-layer fashion.

In embodiments, a method of fabricating a printed electronic device comprises printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; and printing a plurality of contact pads on the plurality of top electrode traces, wherein the plurality of contact pads are arranged in a another pattern and each electrode trace of the plurality of electrode traces is in electrical communication with an associated contact pad of the plurality of contact pads. In the method, the plurality of electrode traces, the plurality of contact pads, and the plurality of memory cells which are printed may be arranged in any of the corresponding patterns described above. In the method, the plurality of contact pads printed comprises one or more of any of the modified contact pads and one or more of any of the unmodified contact pads as described above.

Methods of using a printed electronic device are also provided. In embodiments, such a method comprises contacting a plurality of contact pads of a printed electronic device with a plurality of pins of a read/write unit. This contact enables application of voltage waveforms to control the reading/writing of the plurality of memory cells and to sense the state of the memory cells during reading. Any of the printed electronic devices disclosed herein may be used. The configuration of the read/write unit is not particularly limited, provided the plurality of pins is arranged in a pattern corresponding to the pattern of the plurality of contact pads of the printed electronic device. Commercially available read/write units may be used.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, and
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers,
wherein the plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad, wherein the at least one modified contact pad has an irregular pentagonal shape or an irregular hexagonal shape.

2. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, and
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers,
wherein the plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad, wherein the plurality of contact pads comprises multiple modified contact pads comprising at least one irregular pentagonal shaped contact pad and at least one irregular hexagonal shaped contact pad.

3. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, and
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers,
wherein the plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad, wherein the plurality of contact pads is arranged in two linear arrays extending parallel to one another and defining a gap therebetween and wherein the plurality of electrode traces is arranged in a grid pattern positioned in the gap.

4. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, and
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers,
wherein the plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad, wherein the at least one modified contact pad has an edge configured such that a clearance between the edge and a closest neighboring electrode trace is at least $2*\sqrt{2}*$(line registration capability).

5. The device of claim 3, wherein the at least one modified contact pad has an edge configured such that a clearance between the edge and a closest neighboring electrode trace is at least 500 μm.

6. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, and
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers,
wherein the plurality of contact pads comprises at least one unmodified contact pad having a surface area, shape and size, the plurality of contact pads further comprising at least one modified contact pad having a reduced surface area, and a different size, a different shape, or both, as compared to the at least one unmodified contact pad, wherein an end of each electrode trace of the plurality of electrode traces extends linearly to the associated contact pad and wherein the at least one modified contact pad has an edge which is linear and oriented parallel to a closest neighboring electrode trace.

7. The device of claim 6, wherein the at least one modified contact pad has a non-rectangular polygonal shape.

8. The device of claim 7, wherein the at least one modified contact pad has an irregular, non-rectangular polygonal shape.

9. The device of claim 3, wherein the at least one unmodified contact pad has a rectangular shape.

10. The device of claim 3, wherein an end of each electrode trace of the plurality of electrode traces extends linearly to the associated contact pad and wherein the at least one modified contact pad has an edge which is linear and oriented parallel to a closest neighboring electrode trace.

11. The device of claim 10, wherein the at least one modified contact pad has a non-rectangular polygonal shape and the at least one unmodified contact pad has a rectangular shape.

12. The device of claim 11, wherein the at least one modified contact pad has an irregular, pentagonal shape.

13. A plurality of electronic devices comprising a substrate and a plurality of electronic devices on the substrate, each device configured according to the device of claim 3.

14. A method of fabricating the device of claim 3, the method comprising:
printing a plurality of bottom electrode traces on a substrate;
printing the layer of the ferroelectric material on the plurality of bottom electrode traces;
printing a plurality of top electrode traces on the layer of the ferroelectric material, wherein the plurality of bottom and top electrode traces forms the plurality of electrode traces arranged in the another pattern and defines the plurality of memory cells, each memory cell located at the intersection of the pair of electrode traces of the plurality of electrode traces; and
printing the plurality of contact pads on the plurality of electrode traces, wherein the plurality of contact pads is arranged in the pattern and each electrode trace of the plurality of electrode traces is in electrical communication with the associated contact pad of the plurality of contact pads,
wherein the plurality of contact pads comprises the at least one unmodified contact pad having the surface area, shape and size, the plurality of contact pads further comprising the least one modified contact pad having the reduced surface area, and the different size, the different shape, or both, as compared to the at least one unmodified contact pad, and wherein the plurality of contact pads is arranged in the two linear arrays extending parallel to one another and defining the gap therebetween and wherein the plurality of electrode traces is arranged in the grid pattern positioned in the gap.

15. A method of using the device of claim 3, the method comprising contacting the plurality of contact pads of the device of claim 3 with a plurality of pins of a read/write unit.

* * * * *